United States Patent
Shinn et al.

(10) Patent No.: US 8,748,222 B2
(45) Date of Patent: Jun. 10, 2014

(54) METHOD FOR FORMING OXIDE THIN FILM TRANSISTOR

(75) Inventors: Ted-Hong Shinn, Hsinchu (TW); Henry Wang, Hsinchu (TW); Fang-An Shu, Hsinchu (TW); Yao-Chou Tsai, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 264 days.

(21) Appl. No.: 12/774,562

(22) Filed: May 5, 2010

(65) Prior Publication Data

US 2011/0189818 A1     Aug. 4, 2011

(30) Foreign Application Priority Data

Jan. 29, 2010   (TW) ................................ 99102730 A (51) Int. Cl.
  *H01L 21/00*   (2006.01)
  *H01L 29/786*  (2006.01)
  *H01L 29/10*   (2006.01)
  *H01L 21/34*   (2006.01)

(52) U.S. Cl.
  CPC ...... *H01L 29/78693* (2013.01); *H01L 29/1083* (2013.01); *H01L 29/78609* (2013.01); *H01L 21/34* (2013.01)
  USPC ............... 438/104; 438/30; 438/59; 438/149; 438/160; 438/166; 257/67; 257/69; 257/347; 257/E29.293; 257/E21.461

(58) Field of Classification Search
  None
  See application file for complete search history.

(56) References Cited

U.S. PATENT DOCUMENTS

2008/0296568 A1*   12/2008   Ryu et al. ................. 257/43

FOREIGN PATENT DOCUMENTS

| JP | 2009302352 A | 12/2009 |
|----|-----|-----|
| TW | 518660 B | 1/2003 |

OTHER PUBLICATIONS

Sen et al. ("Study and characterization of PECVD oxides", Phys. Stat. Sol. (a) 105, pp. 171-176, 1988).*
Xu et al. ("Rapid thermal chemical vapor deposition of thin silicon oxide films using silane and nitrous oxide", Applied Physics Letters, 60 (24), pp. 3063-30-65, 1992).*
Olasupo et al. ("Leakage Current Mechanism in Sub-micron Polysilicon Thin-Film Transistor," IEEE Transaction on Electron Devices, vol. 43, No. 8, pp. 1218-1223 1996).*
Roy et al. ("Leakage Current Mechanisms and Leakage reduction Techniques in Deep Submicroemeter CMOS Circuits," Proc. of IEEE, vol. 91, No. 2, pp. 305-327, Feb. 2003).*

* cited by examiner

*Primary Examiner* — Yasser A Abdelaziez
(74) *Attorney, Agent, or Firm* — Chun-Ming Shih (57) ABSTRACT

A method for manufacturing oxide thin film transistors includes steps of: forming a gate, a drain electrode, a source electrode, and an oxide semiconductor layer respectively. The oxide semiconductor layer is formed on the gate electrode; the drain electrode and the source electrode are formed at two opposite sides of the oxide semiconductor layer. The method further includes a step of depositing a dielectric layer of silicon oxide, and a reacting gas for depositing the silicon oxide includes silane and nitrous oxide. A flow rate of nitrous oxide is in a range from 10 to 200 standard cubic centimeters per minute (SCCM). Oxide thin film transistors manufactured by above method has advantages of low leakage, high mobility, and other integrated circuit member can be directly formed on the thin film transistor array substrate of a display device.

6 Claims, 6 Drawing Sheets

METHOD FOR FORMING OXIDE THIN FILM TRANSISTOR

CROSS-REFERENCE TO RELATED APPLICATIONS

This application claims the right of priority based on Taiwan Patent Application No. 099102730 entitled "Method for Forming Oxide Thin Film Transistor", filed on Jan. 29, 2010, which is incorporated herein by reference and assigned to the assignee herein.

BACKGROUND

1. Technical Field

The present invention relates to a method for forming thin film transistors, and in particular to a method for forming oxide thin film transistors.

2. Related Art

Thin film transistor display devices such as thin film transistor liquid crystal displays (TFT LCD), electrphoretic displays (EPD) and organic light emitting diode displays (OLED) are widely employed in various electronic applications, for example, small size applications such as mobile phones, and great size (e.g., 40 inches) television sets. Thus, the studying and development of the structure and manufacturing process of thin film transistors are always of concern to people.

Figure 1:
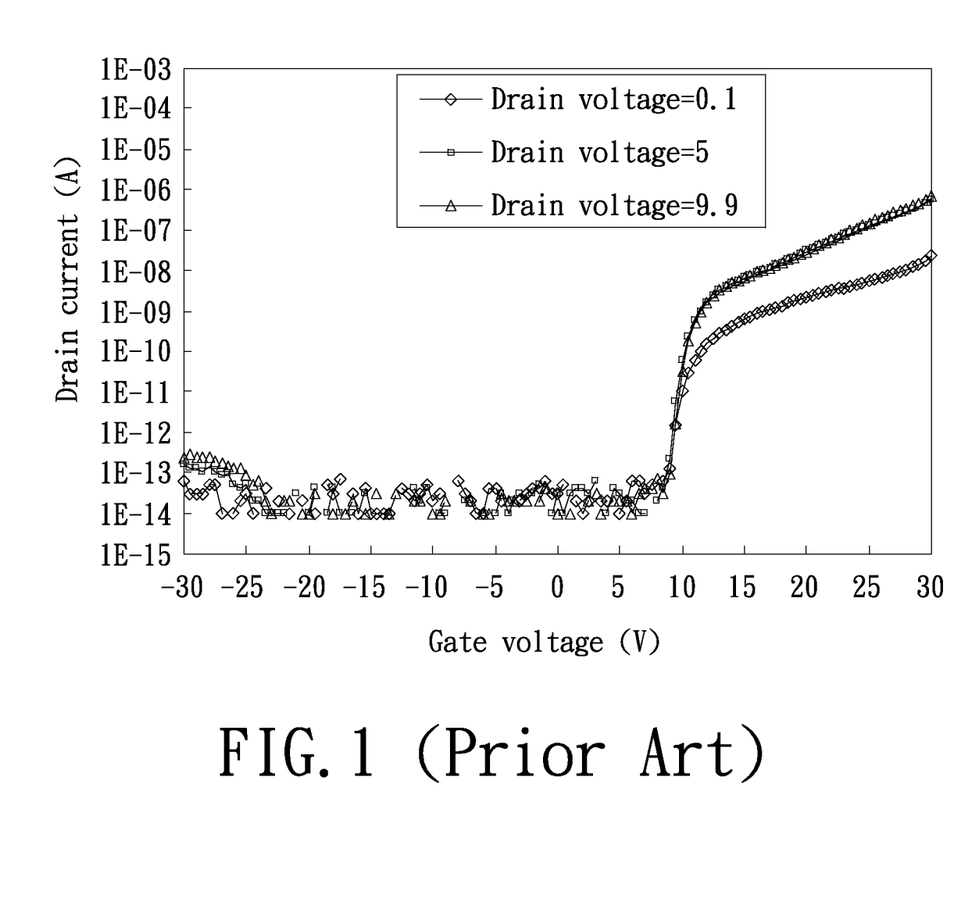
FIG. 1 is a scatter diagram showing the voltage-current (Vg-Id) characteristic curve of a transistor applied in a conventional TFT LCD.

Conventional technique of employing amorphous silicon (a-Si) as the core of the transistors can't meet the requirements in some fields. For example, the electron mobility of a-Si is generally less than 1 square centimeter per volt second ($cm^2/V \cdot sec$). However, in applications that require high electron mobility such as active-matrix organic light-emitting diode (AMOLED), the electron mobility should reach to or greater than 2 $cm^2/V \cdot sec$. For current leakage, referring to FIG. 1, which is a scatter diagram showing the voltage-current (Vg-Id) characteristic curve of a transistor applied in a conventional TFT LCD, it is illustrated that the leakage current is generally between $10^{-12}$ amperes (A) and $10^{-14}$ A, and is difficult to be less than $10^{-14}$ A. In addition, in order to simplify the manufacturing process and the structure, the technique of directly integrating other circuit member and functions on the thin film transistors substrate is developed out. However, conventional a-Si is also not competent for such applications. Besides, the stability of a-Si is low and is not easy to meet the standards of mass production.

Low temperature poly-silicon (LTPS) can overcome aforementioned problems, however the manufacturing process of LTPS is hard and the yield rate is low, and thus it is difficult to apply LTPS in commercial products.

Oxide transistors have the advantages of high electron mobility and high stability, and can solve above problems. However, because the oxygen contained in the oxide semiconductor, a redox reaction easily occurs in the manufacturing process. Thus, there is a desire to provide a manufacturing process that can prevent the redox reaction of the oxide semiconductor and the obtained transistors have the advantages of low current leakage and high electron mobility.

BRIEF SUMMARY

The present invention provides a method for forming oxide thin film transistors than can overcome aforementioned problems.

An embodiment of the present invention provides a method for forming oxide thin film transistors, which includes the steps of: forming a gate electrode, a drain electrode, a source electrode, and an oxide semiconductor layer respectively. The oxide semiconductor layer is formed on the gate electrode; the drain electrode and the source electrode are formed at two opposite sides of the oxide semiconductor layer. The method further includes a step of depositing at least one dielectric layer of silicon oxide, and a reacting gas for depositing the silicon oxide includes silane and nitrous oxide. A flow rate of nitrous oxide is in the range from 10 to 200 standard cubic centimeters per minute (SCCM).

Another embodiment of the present invention also provides a method for forming oxide thin film transistors, which includes the steps of: providing a substrate; forming a gate electrode on an upper surface of the substrate; performing a first depositing process to form a gate dielectric layer on a portion of the upper surface of the substrate and the gate electrode; forming an oxide semiconductor layer on the gate dielectric layer; forming a source electrode and a drain electrode on the oxide semiconductor layer; performing a second depositing process to form a protective layer covering the substrate, the source electrode, the drain electrode, and the oxide semiconductor layer. A reacting gas for at least one of the first and second depositing process includes silane and nitrous oxide, and a flow rate of nitrous oxide is in the range from 10 to 200 standard cubic centimeters per minute (SCCM).

Another embodiment of the present invention also provides a method for forming oxide thin film transistors, which includes the steps of: providing a substrate; forming a source electrode and a drain electrode on the substrate; forming an oxide semiconductor layer on the substrate to connect the source electrode and the drain electrode; performing a first depositing process to form a gate dielectric layer to cover the substrate, the source electrode, the drain electrode and the oxide semiconductor layer; forming a gate electrode on the gate dielectric layer; performing a second depositing process to form a protective layer to cover the gate electrode and the gate dielectric layer. The gate dielectric layer and the protective layer are comprised of silicon oxide. A reacting gas for at least one of the first and second depositing process includes silane and nitrous oxide, and a flow rate of nitrous oxide is in the range from 10 to 200 standard cubic centimeters per minute (SCCM).

In another embodiment of the present invention, a flow rate of the silane is in the range from 0.5 to 5 SCCM.

In another embodiment of the present invention, the depositing process is plasma enhanced chemical vapor deposition (PECVD).

In another embodiment of the present invention, an electric power applied in the depositing process is in the range from 0.5 KW to 10 KW.

In another embodiment of the present invention, the oxide semiconductor layer comprises zinc oxide, zinc tin oxide, chromium tin oxide, gallium tin oxide, titanium tin oxide, indium gallium zinc oxide, copper aluminum oxide, strontium copper oxide, or lanthanum copper oxysulfide.

According to measuring results, oxide thin film transistors manufactured by above method has advantages of low current leakage, high electron mobility, and other integrated circuit member can be directly formed on the thin film transistor array substrate of a display device.

Other aspects, details, and advantages of the present method for forming transistors having oxide semiconductor layer are further described accompanying with preferred embodiments and figures as follows.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Referring to FIGS. 2 through 7, FIGS. 2 through 7 are schematic views illustrating a method for forming an oxide thin film transistor in accordance with a first embodiment of the present invention. The method will be described in detail accompanying with FIGS. 2 through 7 as follows.

Figure 2:
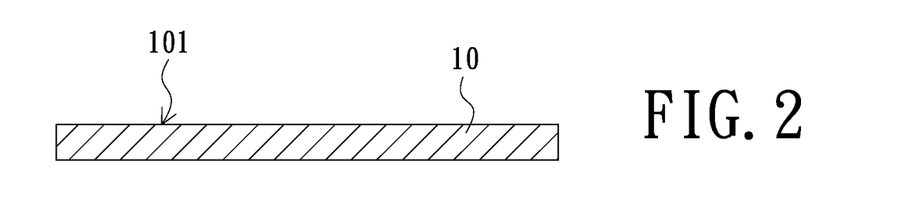
FIGS. 2 through 7 are schematic views illustrating a method for forming an oxide thin film transistor in accordance with a first embodiment of the present invention.

Referring to FIG. 2, a substrate 10 is provided. The substrate 10 has an upper surface 101 for supporting other layers formed thereon. According to different applications, the substrate 10 can comprise different materials, for example, silicon, acrylic resin, or glass. For TFT LCD or EPD applications, the substrate 10 can be a transparent substrate such as a glass substrate.

Figure 3:
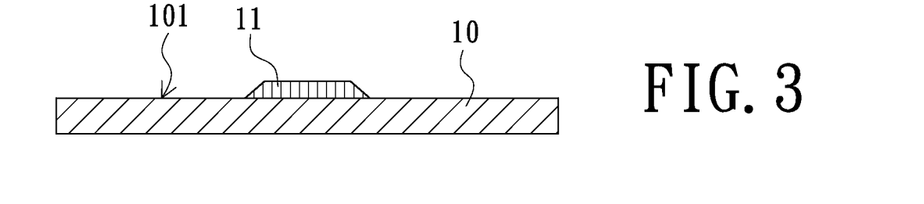

Referring to FIG. 3, a gate electrode 11 is formed on the upper surface 101 of the substrate 10. The gate electrode 11 can be formed by depositing a layer of electrically conductive material on the upper surface and then pattering the layer of electrically conductive material. For example, the electrically conductive material can be doped silicon, aluminum, and copper; or metal compound such as titanium nitride or tungsten titanium. This step of forming the electrode 11 can include, but not limited to, forming scanning lines, capacitive bottom electrodes and/or common electrodes (not shown). The gate electrode 11 can be electrically connected to the scanning lines or is a part of the scanning lines.

Figure 4:
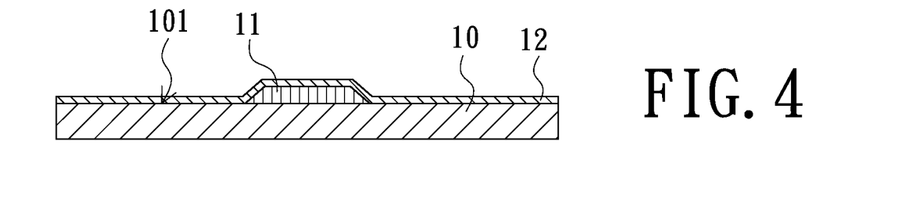

Referring to FIG. 4, after that, a first depositing process is performed to form a gate dielectric layer 12 on a portion of the upper surface 101 that is not covered by the gate electrode 11 and the gate electrode 11. The gate dielectric layer 12 is preferably, but not limited to be, comprised of silicon oxide. In another embodiment, the gate dielectric layer can include other oxide layer such as a silicon nitrous oxide layer. Generally, silicon oxide can be deposited by employing an organic silicon compound, for example, tetraethoxysilane (TEOS), or silane as a silicon source and an oxidant, for example oxygen, ozone, oxynitride ($NO_x$) as an oxygen source. The first depositing process includes physical vapor deposition or chemical vapor deposition.

In the present embodiment, the first depositing process is plasma enhanced chemical vapor deposition (PECVD), and a reacting gas used in the PECVD process includes silane and nitrogen oxygen. A flow rate of nitrous oxide is in the range from 10 to 200 standard cubic centimeters per minute (SCCM) such that the obtained gate dielectric layer 12 has better performance. In other embodiment, a flow rate of nitrous oxide is in the range from 0.5 to 5 SCCM, an electric power applied in the PECVD process is in the range from 0.5 kilowatt (KW) to 10 KW. The thickness of the obtained gate dielectric layer 12 is in the range from 300 angstroms (Å) to 5000 Å.

Figure 5:
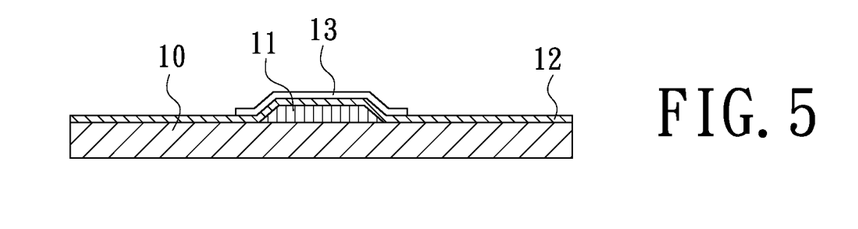

As shown in FIG. 5, then an oxide semiconductor layer 13 is formed on the gate dielectric layer 12. The oxide semiconductor layer 13 is the channel layer of the transistor, and the material of the oxide semiconductor 13 can comprise zinc oxide, zinc tin oxide, chromium tin oxide, gallium tin oxide, titanium tin oxide, indium gallium zinc oxide, copper aluminum oxide, strontium copper oxide, and lanthanum copper oxysulfide. In the present embodiment of the present invention, the oxide semiconductor layer 13 can be indium gallium zinc oxide, and a flow rate of argon gas used in the process for forming the indium gallium zinc oxide is 50 SCCM, an electric power is 3.5 KW, a volume ratio of oxygen in the reacting gas for forming the indium gallium zinc oxide is 9%. After the oxide semiconductor layer 13 is deposited, an ion implanting process can also be performed to dope ions into the channel area thereby controlling the conductivity of the transistor. In another embodiment, the method can also include forming a doped source area and a doped drain area of the oxide semiconductor layer 13.

Figure 6:
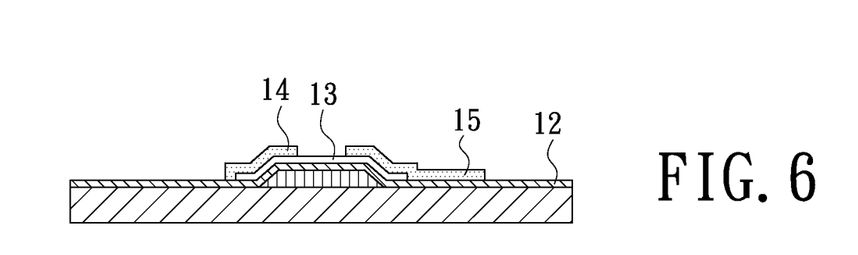

Referring to FIG. 6, a source electrode 14 and a drain electrode 15 are formed on the oxide semiconductor layer 13. The source electrode 14 and the drain electrode 15 can comprise doped silicon, copper or aluminum, or metal compounds such as titanium nitride, tungsten titanium. This step of forming the source electrode 14 and the drain electrode 15 can include, but is not limited to be, forming data lines and/or capacitive top electrode (not shown). The drain electrode 14 can be electrically connected to the data lines or is a part of the data lines.

Figure 7:
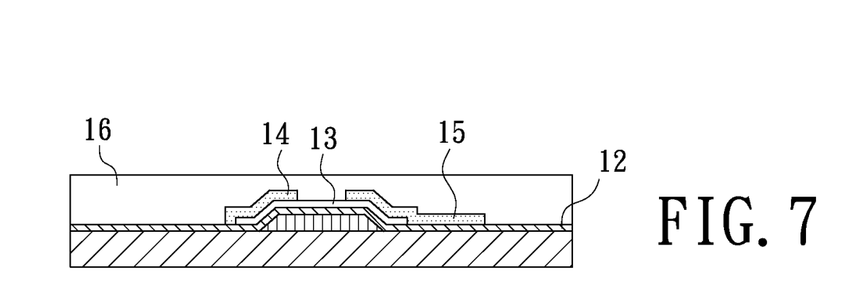

Referring to FIG. 7, a second depositing process is performed to form a protective layer 16 to cover the substrate 10, the source electrode 14, the drain electrode 15 and the oxide semiconductor layer 13. The protective layer 16 can comprise, but is not limited to, silicon oxide. In another embodiment, the protective layer 16 can comprise other oxide such as silicon oxynitride. Generally, silicon oxide can be deposited by employing an organic silicon compound, for example, tetraethoxysilane (TEOS), or silane as a silicon source and an oxidant, for example oxygen, ozone, oxynitride ($NO_x$) as an oxygen source, and the depositing process for silicon oxide can be physical vapor deposition or chemical vapor deposition.

In the present embodiment, the second depositing process is PECVD process, the reacting gas includes silane and nitrous oxygen and the flow rate of nitrous oxygen is in the range 10 SCCM to 200 SCCM. The flow rate of silane is in the range from 0.5 SCCM to 5 SCCM. The electric power applied in the PECVD process is in the range from 0.5 KW to 10 KW. The thickness of the obtained protective layer 16 is in the range from 300 Å to 5000 Å.

Figure 8:
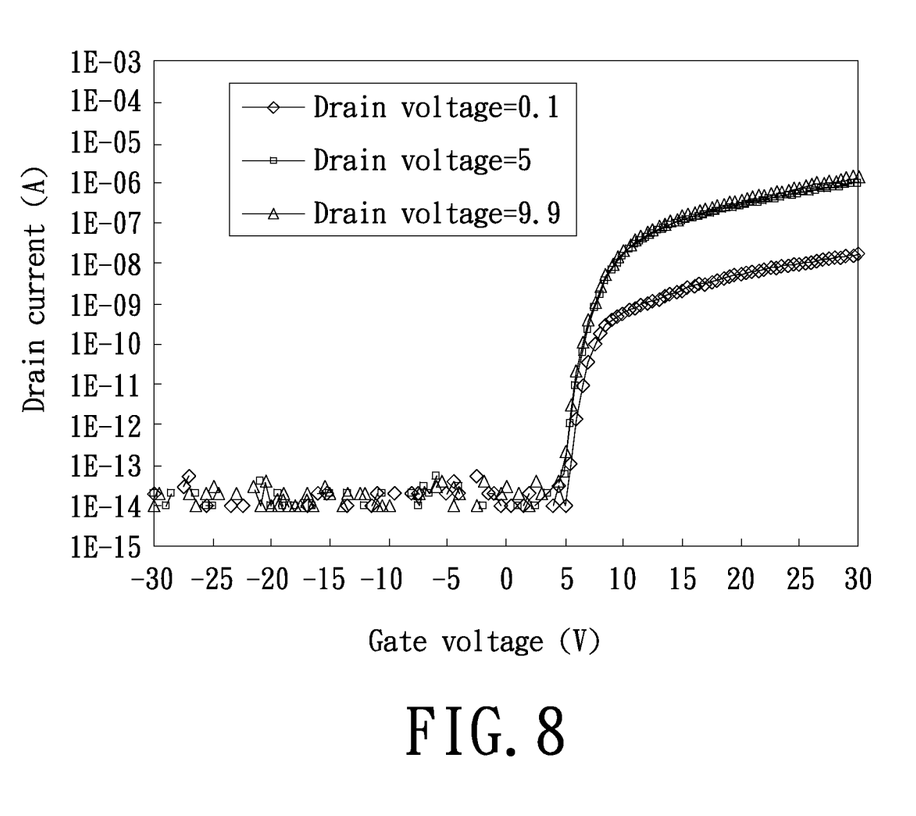
FIG. 8 is a scatter diagram showing the Vg-Id characteristic of the oxide thin film transistor manufactured by above method.

According to above described method, a bottom gate oxide semiconductor transistor is obtained. As shown in FIG. 8, which shows a Vg-Id characteristic of the oxide thin film transistor manufactured by above method, the current leakage can be less than $10^{-14}$ A. Furthermore, the oxide thin film transistor also employs oxide semiconductor as the core thereof and thus has the advantages of high electron mobility and other integrated circuit member can be directly formed on the thin film transistor array substrate of a display device.

Referring to FIGS. 9 through 14, FIGS. 9 through 14 are schematic views illustrating a method for forming an oxide thin film transistor in accordance with the second embodiment of the present invention. The method will be described in detail accompanying with FIGS. 9 through 14 as follows.

Figure 9:
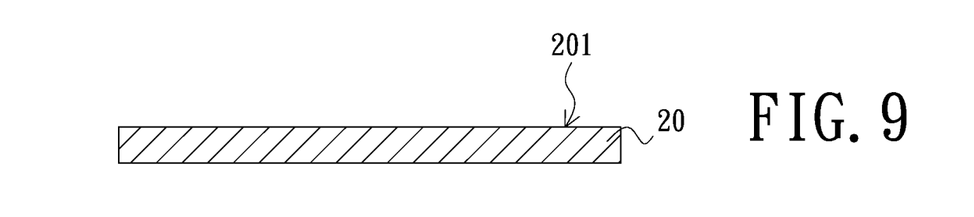
FIGS. 9 through 14 are schematic views illustrating a method for forming an oxide thin film transistor in accordance with the second embodiment of the present invention.

Referring to FIG. 9, a substrate 20 is provided. The substrate 20 has an upper surface 201 for supporting other layers sequentially formed thereon. According to different applications, the substrate 20 can comprise different materials, for example, silicon, acrylic resin, or glass. For TFT LCD or EPD applications, the substrate 20 can be a transparent substrate such as a glass substrate.

Figure 10:
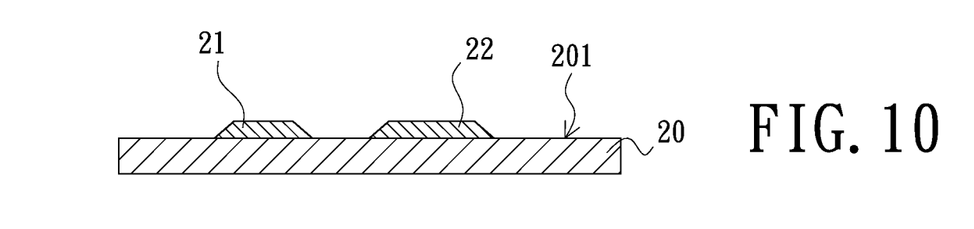

Referring to FIG. 10, a source electrode 21 and a drain electrode 22 are formed on the substrate 20. The source electrode 21 and the drain electrode 22 can comprise doped silicon, copper or aluminum, or metal compounds such as titanium nitride, tungsten titanium.

Figure 11:
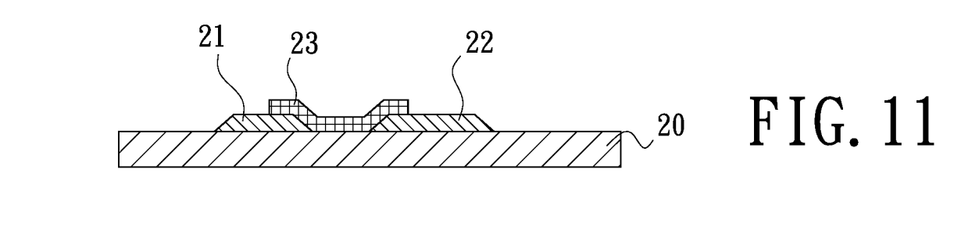

Referring to FIG. 11, then an oxide semiconductor layer 23 is formed on the substrate 20 to connect the source electrode 21 and the drain electrode 22. The oxide semiconductor layer 23 is the channel layer of the transistor to be formed, and can comprise zinc oxide, zinc tin oxide, chromium tin oxide, gallium tin oxide, titanium tin oxide, indium gallium zinc oxide, copper aluminum oxide, strontium copper oxide, and lanthanum copper oxysulfide. In the present embodiment, the oxide semiconductor layer 23 can comprise indium gallium zinc oxide, and a flow rate of argon gas used in the process for forming the indium gallium zinc oxide is 50 SCCM, an electric power is 3.5 KW, a volume ratio of oxygen in the reacting gas for forming the indium gallium zinc oxide is 9%.

Figure 12:
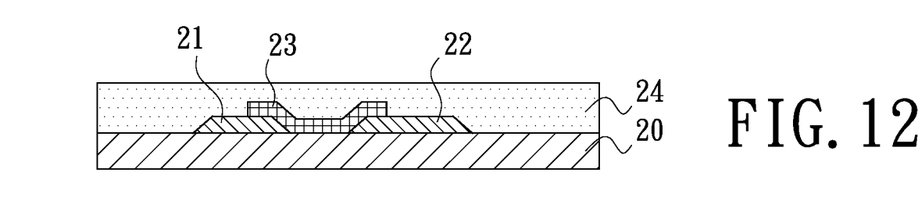

Referring to FIG. 12, a first depositing process is performed to form a gate dielectric layer 24 to cover the substrate 20, the source electrode 21, the drain electrode 22, and the oxide semiconductor layer 23. The gate dielectric layer 24 is preferably, but not limited to be, comprised of silicon oxide. Generally, silicon oxide can be deposited by employing an organic silicon compound, for example, tetraethoxysilane (TEOS), or silane as a silicon source and an oxidant, for example oxygen, ozone, oxynitride ($NO_x$) as an oxygen source. The first depositing process includes physical vapor deposition and chemical vapor deposition.

In the present embodiment, the first depositing process is plasma enhanced chemical vapor deposition (PECVD), and a reacting gas used in the PECVD process includes silane and nitrogen oxygen. A flow rate of nitrous oxide is in the range from 10 to 200 standard cubic centimeters per minute (SCCM) such that the obtained gate dielectric layer 12 has better performance. In other embodiment, a flow rate of nitrous oxide is in the range from 0.5 to 5 SCCM, an electric power applied in the PECVD process is in the range from 0.5 KW to 10 KW. The thickness of the obtained gate dielectric layer 12 is in the range from 300 angstroms (Å) to 5000 Å.

Figure 13:
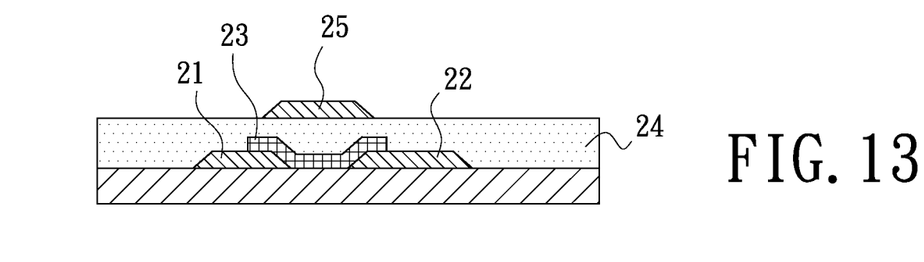

Referring to FIG. 13, a gate electrode 25 corresponding to the oxide semiconductor layer 23 is formed on gate dielectric layer 24. The gate electrode 25 can be formed by depositing a layer of electrically conductive material on gate dielectric layer 24 and then patterning the layer of electrically conductive material. For example, the electrically conductive material can be doped silicon, aluminum, and copper; or metal compound such as titanium nitride or tungsten titanium.

Figure 14:
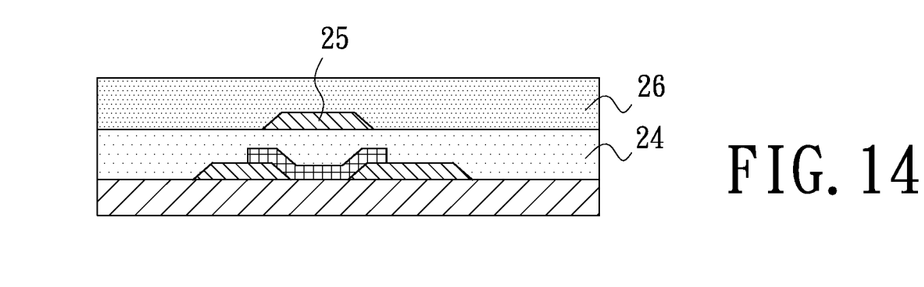

Referring to FIG. 14, a second depositing process is performed to form a protective layer 26 to cover the gate electrode 25 and the gate dielectric layer 24. The protective layer 26 can comprise, but is not limited to, silicon oxide. Generally, silicon oxide can be deposited by employing an organic silicon compound, for example, tetraethoxysilane (TEOS), or silane as a silicon source and an oxidant, for example oxygen, ozone, oxynitride ($NO_x$) as an oxygen source, and the depositing process for silicon oxide can be physical vapor deposition or chemical vapor deposition.

In the present embodiment, the second depositing process is PECVD, the reacting gas includes silane and nitrous oxygen and the flow rate of nitrous oxygen is in the range 10 SCCM to 200 SCCM. The flow rate of silane is in the range from 0.5 SCCM to 5 SCCM. The electric power applied in the PECVD process is in the range from 0.5 KW to 10 KW. The thickness of the obtained protective layer 26 is in the range from 300 Å to 5000 Å. According to above method, a top gate oxide thin film transistor is obtained.

Because the structure of transistor can affect the electron mobility of semiconductors, the top gate transistor is better than bottom gate transistor in this consideration. However, in general TFT LCD applications, considering the requirements of transmitting type display devices and aperture ratio, the bottom gate transistor is also acceptable. Both top gate transistors and bottom gate transistors can be applied in reflective display devices, in particular electro-phoretic display devices.

Above described embodiments disclose a method for forming an oxide thin film transistor. According to measuring results, the oxide thin film transistor manufactured using above method has advantages of low current leakage, high electron mobility, and other integrated circuit member can be directly formed on the thin film transistor array substrate of a display device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for forming an oxide thin film transistor, comprising:
   providing a substrate;
   forming a gate electrode, a source electrode, a drain electrode and an oxide semiconductor layer on the substrate, the oxide semiconductor layer being formed on a surface of the gate electrode, and the source electrode and the drain electrode being respectively formed on two opposite sides of the oxide semiconductor layer, the oxide semiconductor layer being composed of indium gallium zinc oxide, a flow rate of argon gas used in a process for forming the oxide semiconductor layer being 50 SCCM, an electric power used in the process for forming the oxide semiconductor layer being 3.5 KW, and a volume ratio of oxygen in a reacting gas for forming the oxide semiconductor layer being 9%; and
   performing a depositing process to form at least one dielectric layer of silicon oxide, a reacting gas for the depositing process comprising silane and nitrous oxide, a flow rate of nitrous oxide being in the range from 10 to 200 SCCM,
   wherein a thickness of the dielectric layer of silicon oxide is in the range from 300 Å to 5000 Å, the depositing process is a plasma enhanced chemical vapor deposition (PECVD) process, an electric power applied in the PECVD process is in the range from 0.5 KW to 10 KW.

2. A method for forming an oxide thin film transistor, comprising:
   providing a substrate;
   forming a gate electrode on an upper surface of the substrate;
   performing a first depositing process to form a gate dielectric layer on a portion of the upper surface of the substrate and the gate electrode, a thickness of the gate dielectric layer being in the range from 300 Å to 5000 Å;

forming an oxide semiconductor layer on the gate dielectric layer, the oxide semiconductor layer being composed of indium gallium zinc oxide;

forming a source electrode and a drain electrode on the oxide semiconductor layer;

performing a second depositing process to form a protective layer covering the substrate, the source electrode, the drain electrode and the oxide semiconductor layer;

wherein the gate dielectric layer and the protective layer comprise silicon oxide, a reacting gas for at least one of the first and second depositing process comprising silane and nitrous oxide, a flow rate of nitrous oxide being in the range from 10 to 200 SCCM, a flow rate of argon gas used in a process for forming the oxide semiconductor layer is 50 SCCM, an electric power used in a process for forming the oxide semiconductor layer is 3.5 KW, a volume ratio of oxygen in the reacting gas for forming the oxide semiconductor layer is 9%, the depositing process is a PECVD process and an electric power applied in the PECVD process is in the range from 0.5 KW to 10 KW.

3. The method of claim 2, wherein the substrate is a glass substrate.

4. The method of claim 2, wherein the oxide semiconductor layer comprises zinc oxide, zinc tin oxide, chromium tin oxide, gallium tin oxide, titanium tin oxide, indium gallium zinc oxide, copper aluminum oxide, strontium copper oxide, or lanthanum copper oxysulfide.

5. The method of claim 1, wherein the oxygen loss from the oxide semiconductor layer during the forming process thereof is compensated by the nitrous oxide for enhancing stability of the oxide thin film transistor.

6. The method of claim 2, wherein the oxygen loss from the oxide semiconductor layer during the forming process thereof is compensated by the nitrous oxide for enhancing stability of the oxide thin film transistor.

* * * * *